(12) United States Patent
Oh et al.

(10) Patent No.: US 9,100,420 B2
(45) Date of Patent: Aug. 4, 2015

(54) SYSTEM FOR REMOTELY MANAGING ELECTRIC VEHICLE

(75) Inventors: Jung Hwan Oh, Seoul (KR); Jae Seong Park, Daejeon (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 286 days.

(21) Appl. No.: 13/207,377

(22) Filed: Aug. 10, 2011

(65) Prior Publication Data

US 2012/0059533 A1 Mar. 8, 2012

(30) Foreign Application Priority Data

Sep. 3, 2010 (KR) .................. 10-2010-0086737

(51) Int. Cl.
- B60L 11/18 (2006.01)
- G01R 21/00 (2006.01)
- B60W 10/30 (2006.01)
- H04L 29/08 (2006.01)

(52) U.S. Cl.
CPC ............ H04L 67/125 (2013.01); B60L 11/1844 (2013.01); B60W 10/30 (2013.01); G01R 21/00 (2013.01); B60L 2230/00 (2013.01); Y02T 90/168 (2013.01); Y04S 30/12 (2013.01)

(58) Field of Classification Search
USPC ........................................ 701/2, 22; 320/109
See application file for complete search history.

(56) References Cited

U.S. PATENT DOCUMENTS

| | | | |
|---|---|---|---|
| 2009/0177580 A1 | 7/2009 | Lowenthal et al. | |
| 2009/0177595 A1* | 7/2009 | Dunlap et al. | 705/412 |
| 2009/0195349 A1* | 8/2009 | Frader-Thompson et al. | 340/3.1 |
| 2010/0161481 A1* | 6/2010 | Littrell | 705/40 |
| 2010/0262566 A1* | 10/2010 | Yamamoto | 705/412 |

(Continued)

FOREIGN PATENT DOCUMENTS

| | | |
|---|---|---|
| CN | 101162264 | 4/2008 |
| CN | 101351803 | 1/2009 |

(Continued)

OTHER PUBLICATIONS

KCiCommunications. 'T-Eye ADR3000: Mobile Event Data Recorder: Product Introduction', [no publication date specified], KCiCommunications, Inc., http://www.kcicommunications.com/pdf/teye_system_overview_specs.pdf, Archived by archive.org on Aug. 24, 2009.*

(Continued)

Primary Examiner — Rami Khatib
Assistant Examiner — Jeffrey Boomer
(74) Attorney, Agent, or Firm — Lee, Hong, Degerman, Kang & Waimey (57) ABSTRACT

In a system for remotely managing an electric vehicle, a meter related to charge of the electric vehicle, installed in each parking lot, and a meter installed in each home communicate information related to the electric vehicle using a communication network constructed for the purpose of energy management. The meter in each home is linked with an in-home display (IHD) device installed in the home, and a user identifies and manages, in the home, information of the user's own electric vehicle through the IHD device. The user remotely controls the electric vehicle in the parking lot through the IHD device. Accordingly, it is possible to considerably improve convenience in the use of the electric vehicle, in relation to information management or control of the electric vehicle.

9 Claims, 8 Drawing Sheets

(56) References Cited

U.S. PATENT DOCUMENTS

| | | |
|---|---|---|
| 2011/0029144 A1* | 2/2011 | Muller et al. ............... 700/293 |
| 2011/0057815 A1* | 3/2011 | King et al. ............... 340/932.2 |
| 2011/0153474 A1* | 6/2011 | Tormey et al. ............... 705/31 |
| 2012/0191242 A1* | 7/2012 | Outwater et al. ............ 700/236 |
| 2013/0024306 A1* | 1/2013 | Shah et al. ................... 705/17 |
| 2013/0179061 A1* | 7/2013 | Gadh et al. .................. 701/123 |

FOREIGN PATENT DOCUMENTS

| | | |
|---|---|---|
| JP | 2002-264769 | 9/2002 |
| JP | 2006-347295 | 12/2006 |
| JP | 2009-303456 | 12/2009 |
| JP | 2010-512727 | 4/2010 |
| JP | 2010-518795 | 5/2010 |
| JP | 2010-183824 | 8/2010 |
| JP | 2010-187451 | 8/2010 |
| JP | 2012-14702 | 1/2012 |
| JP | 2012-16272 | 1/2012 |
| JP | 2012-60637 | 3/2012 |
| JP | 2012-69105 | 4/2012 |
| KR | 10-2009-0119833 | 11/2009 |
| WO | 2007/094837 | 8/2007 |

OTHER PUBLICATIONS

ODB-codes.com; Accessed http://odb-codes.com/trouble_codes/ford on Dec. 8, 2014. Archived by archive.org on Apr. 30, 2010.*

Ki Bong Ann et al., "Smart grid and Home EV Charging Equipment System", Apr. 2010, 4 pages.

Korean Intellectual Property Office Application Serial No. 10-2010-0086737, Office Action dated Nov. 21, 2011, 2 pages.

Japan Patent Office Application Serial No. 2011-191368, Office Action dated Jan. 22, 2013, 4 pages.

The State Intellectual Property Office of the People's Republic of China Application Serial No. 201110264024.4, Office Action dated Sep. 3, 2013, 6 pages.

The State Intellectual Property Office of the People's Republic of China Application Serial No. 201110264024.4, Office Action dated Oct. 20, 2014, 7 pages.

* cited by examiner

SYSTEM FOR REMOTELY MANAGING ELECTRIC VEHICLE

CROSS-REFERENCE TO RELATED APPLICATION

This application claims the benefit of earlier filing date and right of priority to Korean Patent Application No. 10-2010-0086737, filed Sep. 3, 2010, the contents of which is hereby incorporated herein by reference in its entirety.

BACKGROUND OF THE INVENTION

1. Field of the Invention

An aspect of the present invention relates to a system for remotely managing an electric vehicle using a parking lot in which the charge of the electric vehicle and a meter installed in a home of an electric vehicle owner.

2. Description of the Related Art

Recently, a plan for differentiating the price of energy depending on production and consumption situations of the energy has been conceived to effectively use limited energy resources. Accordingly, a technology such as a smart grid or smart meter has become an object of interest.

The smart grid is a next-generation power network that can optimize energy efficiency and create a new added value by enabling customers to bidirectionally exchange real-time information with each other through combination of information technology (IT) with a power network.

The smart meter refers to an electronic meter to which a communication function is added. Since the smart meter can perform bidirectional communication between an energy supplier and a customer, the remote inspection can be performed in real time, and the amount of power consumption can be precisely metered.

Meanwhile, as electric vehicles have come into wide use, a charging apparatus capable of charging electric vehicles are spread in parking lots. The charging apparatus may be linked with a meter so as to impose a charging rate on an electric vehicle owner.

A meter is installed in each home to inspect the energy consumption amount of electricity, gas, water or the like.

When considering that meters are linked through a communication network for energy management, the meters can not only meter the energy consumption amount but also be applied to various fields related to the use of electric vehicles.

SUMMARY OF THE INVENTION

Embodiments of the present invention provide a system for remotely managing an electric vehicle, in which a meter installed in each parking lot in relation to the charge of the electric vehicle and a meter installed in each home communicate information related to the electric vehicle with each other using a communication network constructed for the purpose of energy management, so that it is possible to allow a user to conveniently manage and control the user's own electric vehicle in the user's home.

According to an aspect of the present invention, there is provided a system for remotely managing an electric vehicle, the system including: a first meter configured to meter an amount of electric energy used to charge an electric vehicle and receive data through communication with the electric vehicle; a remote management server configured to receive information of the electric vehicle from the first meter through a communication network; a second meter configured to receive the information of the electric vehicle from the remote management server; and an in-home display (IHD) device configured to analyze and manage the information of the electric vehicle received from the second meter.

According to another aspect of the present invention, there is provided a system for remotely managing an electric vehicle, the system including: a first meter configured to meter an amount of electric energy used to charge an electric vehicle and receive data through communication with the electric vehicle; a first repeater configured to receives information of the electric vehicle from the first meter and relay the received information; a remote management server configured to receives the information of the electric vehicle from the first repeater; a second repeater configured to relay the information of the electric vehicle, which the remote management server transfers to an electric vehicle owner; a second meter configured to receive the information of the electric vehicle from the second repeater; and an IHD device configured to analyze and manage the information of the electric vehicle, received from the second meter.

The first meter and the first repeater may communicate with each other through a near-field communication network, and the second meter and the second repeater may communicate with each other through the near-field communication network.

The near-field communication network may include at least one of a wireless local area network (WLAN), a power line communication (PLC) network, a Bluetooth network and a Zigbee network.

The first and second meters may communicate with the remote management server through a wide area communication network.

The first and second repeaters may communicate with the remote management server through the wide area communication network.

The wide area communication network may include at least one of a wireless LAN, an Internet network, a code division multiple access (CDMA) network, a personal communication service (PCS) network, a personal handyphone service (PHS) network, a wireless broadband Internet (Wibro) network and the PLC network.

The information of the electric vehicle may include at least on of change information and general management information.

The general management information may include at least one of driving record information of the electric vehicle, component change information, video information photographed by a camera and burglar alarm information.

The IHD device may be configured to enable a user to input an electric vehicle control command.

The electric vehicle control command may be transferred to the electric vehicle via the second meter, the remote management server and the first meter.

The electric vehicle control command may include a command for controlling at least one of starting of the electric vehicle, open/close of window, on/off of a headlight and adjustment of internal temperature.

The information of the electric vehicle may include driving record information detected by at least a navigation device and video information photographed by a camera. The IHD device may reproduce a driving path and video of the electric vehicle based on the driving record information and the video information and then display the reproduced driving path and video on a screen.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

The present invention is described more fully hereinafter with reference to the accompanying drawings, in which embodiments of the present invention are shown. This present invention may, however, be embodied in many different forms and should not be construed as limited to the embodiments set forth herein. Rather, these embodiments are provided so that this disclosure is thorough, and will fully convey the scope of the present invention to those skilled in the art.

As electric vehicles have come to a wide use, charging devices capable of charging the electric vehicles are spread in parking lots including a parking lot of a personal house, a parking lot of a shared accommodation such as an apartment building, a public/private parking lot, and the like. The charging devices are linked with meters so as to identify electric vehicles and impose charge rates on electric vehicle owners.

Several parking sections exist in a parking lot in which several electric vehicles can be parked, and a charging device may be installed for each of the parking sections.

Figure 1:
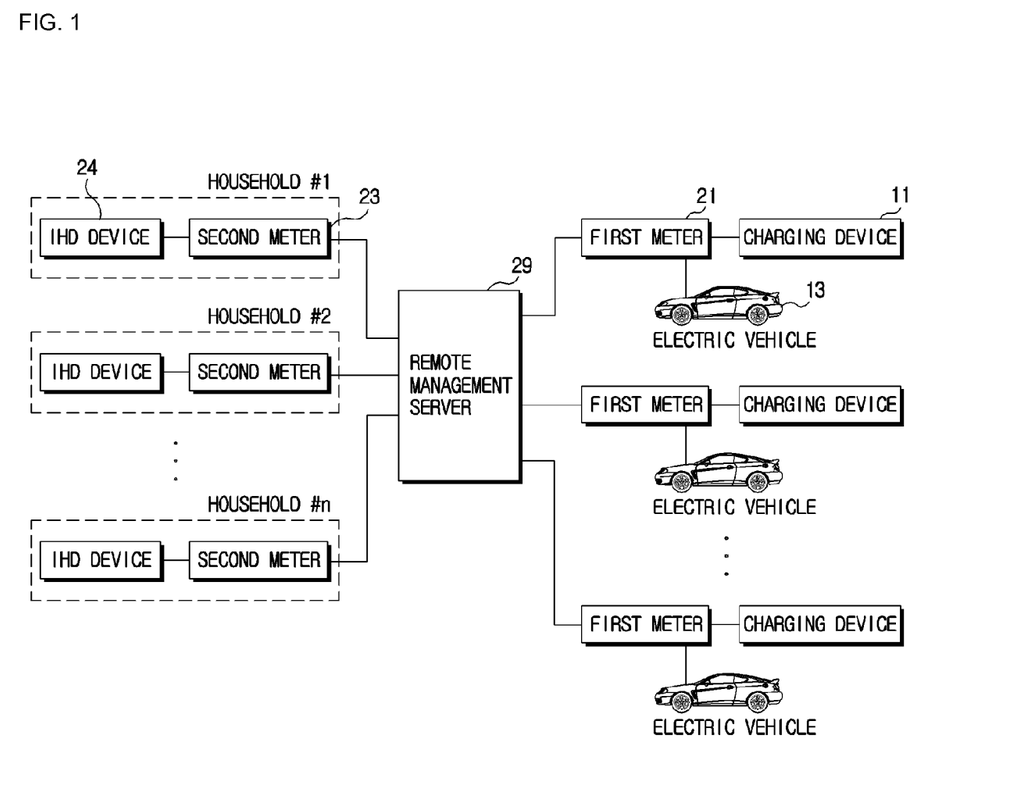
FIG. 1 shows an embodiment of a system for remotely managing an electric vehicle according to the present invention.

FIG. 1 shows an embodiment of a system for remotely managing an electric vehicle according to the present invention. The system includes first meters 21 installed in a parking lot, a remote management server 29, and a second meter 23 and an in-home display (IHD) device 24, installed in each home (household).

Each of the first and second meters 21 and 23 is a meter having a communication function, and may be a smart meter.

The first meters 21 are provided corresponding to charging devices 11, respectively.

The first meter 21 may be configured as a part of the charging device 11. Alternatively, the first meter 21 may be configured as a device separate from the charging device 11 so as to be linked with the charging device 11.

The first meter 21 basically performs, as a meter, functions of metering a consumption amount or charge rate of electric energy used to charge each electric vehicle 13.

Particularly, the first meter 21 receives various types of data from the electric vehicle 13 and transmits the received data to the remote management server 29. Here, the data includes a starting state, an opened/closed state of window, an on/off state of a headlight, and the like.

As occasion demands, it may be variously configured which information the first meter 21 is to transmit to the remote management server 29. Hereinafter, the information that the first meter 21 transmits to the remote management server 29 is referred to as 'electric vehicle information'.

The remote management server 29 receives electric vehicle information from the first meter 21 through a communication network, and transmits the received electric vehicle information to the second meter 23 placed in the home of a corresponding electric vehicle owner.

To this end, the remote management server 29 maintains vehicle identification information for properly identifying each of the electric vehicles and correlation information of the second meter 23 placed in the home of the corresponding electric vehicle owner.

The second meter 23 is installed in the home of each electric vehicle owner so as to meter the amount of energy consumed in the corresponding home.

Since the first meter 21 meters the amount of electric energy used to charge the electric vehicle 13, the first meter 21 is related to the electric energy. However, the second meter 23 may be not only a wattmeter but also a gas or water meter Particularly, the second meter 23 functions to receive electric vehicle information from the remote management server 29. The second meter 23 is linked with the IHD device 24 so as to transfer the electric vehicle information received from the remote management server 29 to the IHD device 24. Here, the IHD device is provided to each home so as to display various energy related information.

The IHD device 24 receives electric vehicle information from the second meter 23 and manages the received electric vehicle information. The IHD device 24 analyzes the received electric vehicle information and processes the analyzed information as various types of information, thereby displaying the processed information on a display screen.

A user can identify not only energy related information but also various types of information on a user's electric vehicle through the IHD device 24.

Figure 2:
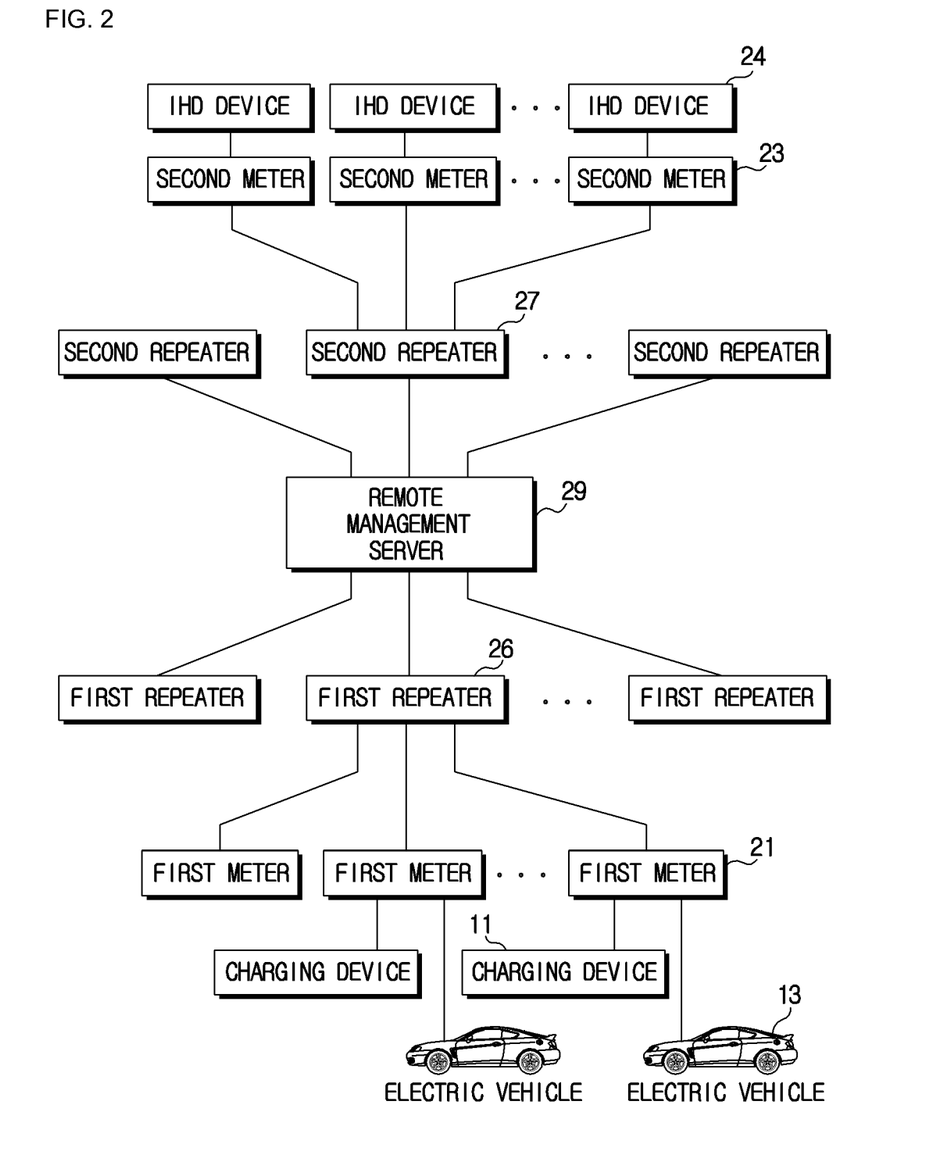
FIG. 2 shows another embodiment of the system according to the present invention.

FIG. 2 shows another embodiment of the system according to the present invention. A first repeater 26 is positioned between the remote management server 29 and each of the first meters 21, and a second repeater 27 is positioned between the remote management server 29 and each of the second meters 23.

The first repeater 26 receives electric vehicle information from a plurality of first meters installed in a parking lot of a personal house or a parking lot of a shared accommodation such as an apartment building, which is positioned in a certain area, and transmits the received electric vehicle information to the remote management server 29. That is, the communication between the first meter 21 and the remote management server 29 is performed via the first repeater 26.

In this instance, the first meter 21 and the first repeater 26 communicate with each other through a near-field communication network. The first repeater 26 and the remote management server 29 communicate with each other through a wide area communication network.

The second repeater 27 communicates with a second meter installed in a personal house or each home of a shared accommodation such as an apartment building, which is positioned in a certain area. The second repeater 27 receives electric vehicle information transmitted from the remote management server 29 and transmits the received electric vehicle information to the second meter 23 of a corresponding home.

That is, the communication between the remote management server 29 and the second meter 23 is performed via the second repeater 27.

In this instance, the remote management server 29 and the second repeater 27 communicate with each other through the wide area communication network. The second repeater 27 and the second meter 23 communicate with each other through the near-field communication network.

The wide area communication network and near-field communication network may be various wired/wireless communication networks.

For example, the wide area communication network may include a wireless local area network (WLAN), an Internet network, a code division multiple access (CDMA) network, a personal communication service (PCS) network, a personal handyphone system (PHS) network, a wireless broadband internet (Wibro) network, a power line communication (PLC) network, and the like.

The near-field communication network may include a WLAN, a PLC network, a Bluetooth network, a Zigbee network, and the like.

Figure 3:
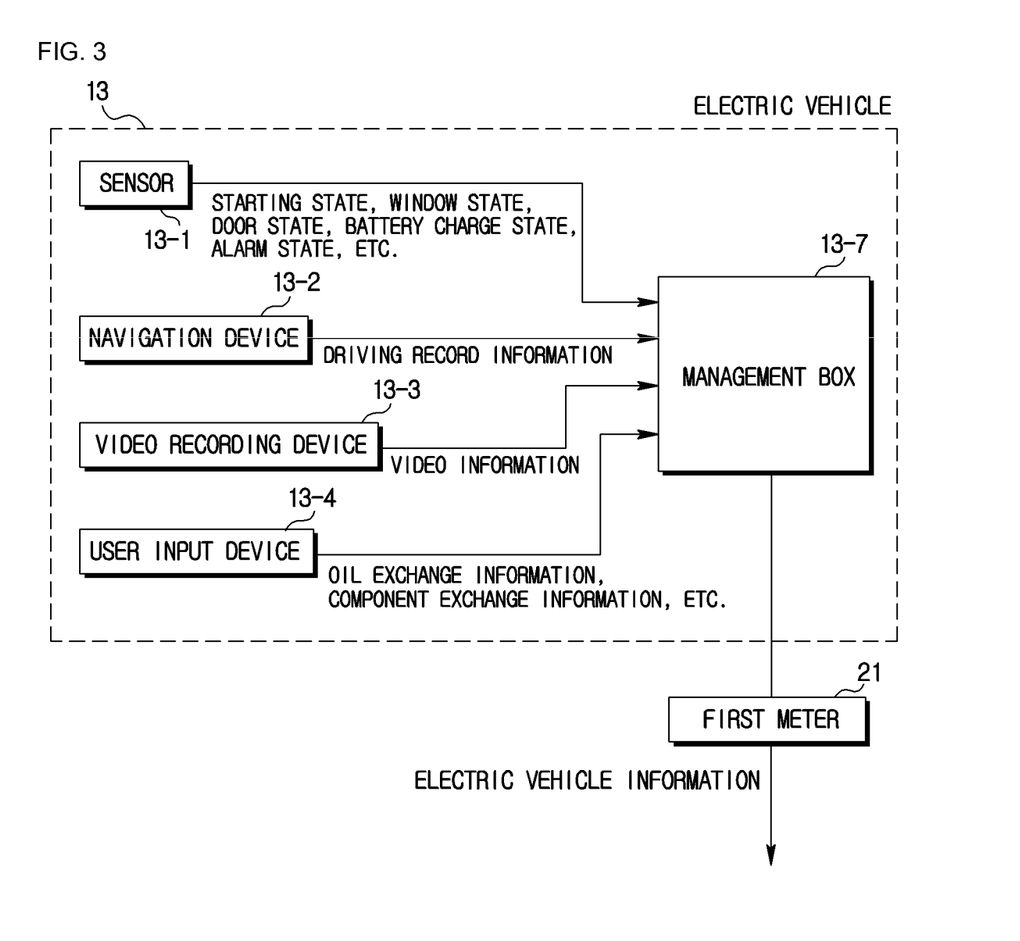
FIG. 3 shows an example illustrating a first meter and an interface of an electric vehicle.

Referring to FIG. 3, the first meter 21 collects various types of information from the electric vehicle 13 and directly transmits the collected information to the remote management server 29 or transmits the collected information to the remote management server 29 through the first repeater 26.

The first meter 21 may collect various types of information including sensor information, driving record information, video information, user input information, and the like.

Here, the sensor information refers to information that various types of sensors can collect. The sensor information may include a starting state, a window state, a door state, a battery charge state, an on/off state of a headlight, a burglar alarm state, and the like.

The driving record information refers to information that a navigation device 12-2 can detect. The driving record information may include information on when and which road the electric vehicle 13 has driven.

The video information refers to information that a video recording device 13-3 photographs through a camera mounted to the electric vehicle.

The user input information refers to information that a user directly inputs through a user input device 13-4. The user input information may include oil change information, component change information, and the like. The user input device 13-4 may be configured as a separate device so as to be installed in the electric vehicle 13, or may be configured so that another device provided with a user interface including the navigation device 13-2, etc. performs the function of the user input device 13-4.

A management box 13-7 of the electric vehicle transfers, to the first meter 21, information obtained from the various types of sensors 13-1, the navigation device 13-2, the video recording device 13-3, the user input device 13-4, and the like.

The information that the first meter 21 collects from an electric vehicle includes information capable of properly identifying the corresponding electric vehicle (hereinafter, referred to as vehicle identification information).

It may be variously configured what will be used as the vehicle identification information. For example, the vehicle identification information may include a vehicle identification number, a residential registration number or address of a corresponding electric vehicle owner, an arbitrarily given number, and the like.

The vehicle identification information may be inputted through the user input device 13-3, or may be transmitted using a radio frequency ID (RFID) technology.

The first meter 21 may communicate with the management box 13-7 of the electric vehicle using various wired/wireless near-field communication schemes. The first meter 21 transmits information received from the management box 13-7 to the remote management server 29 or the first repeater 26. Here, the information received from the management box 13-7 is electric vehicle information and includes vehicle identification information, charge information, and the like.

Figure 4:
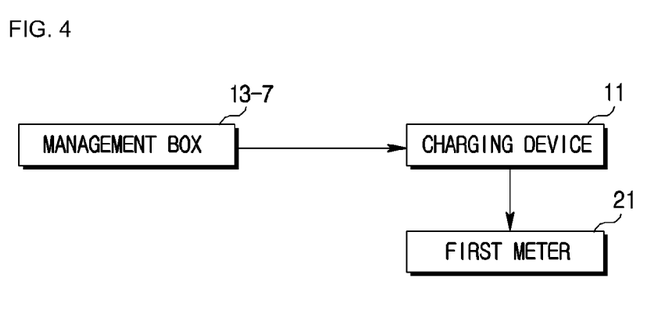
FIG. 4 shows an example in which a charging apparatus collects electric vehicle information and transmits the collected information to the first meter.

Meanwhile, as shown in the example of FIG. 4, the charging device 11 may be configured to perform the function of communicating with the management box 13-7 of the electric vehicle.

In this case, the charging device 11 communicates with the management box 13-7 using various wired/wireless communication schemes, and transfers information received from the management box 13-7 to the first meter 21.

Figure 5:
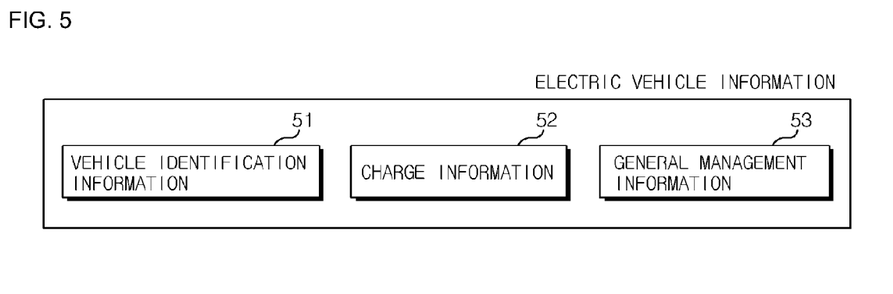
FIG. 5 shows an example of the electric vehicle information transmitted by the first meter.

FIG. 5 shows an example of the electric vehicle information transmitted to the remote management server 29 by the first meter 21. The electric vehicle information may include vehicle identification information 51, charge information 52 and general management information 53.

Here, the charge information refers to an amount or rate of electric energy used to charge the electric vehicle. The general management information refers to various types of information collected from the electric vehicle 13, except the vehicle identification information.

Figure 6:
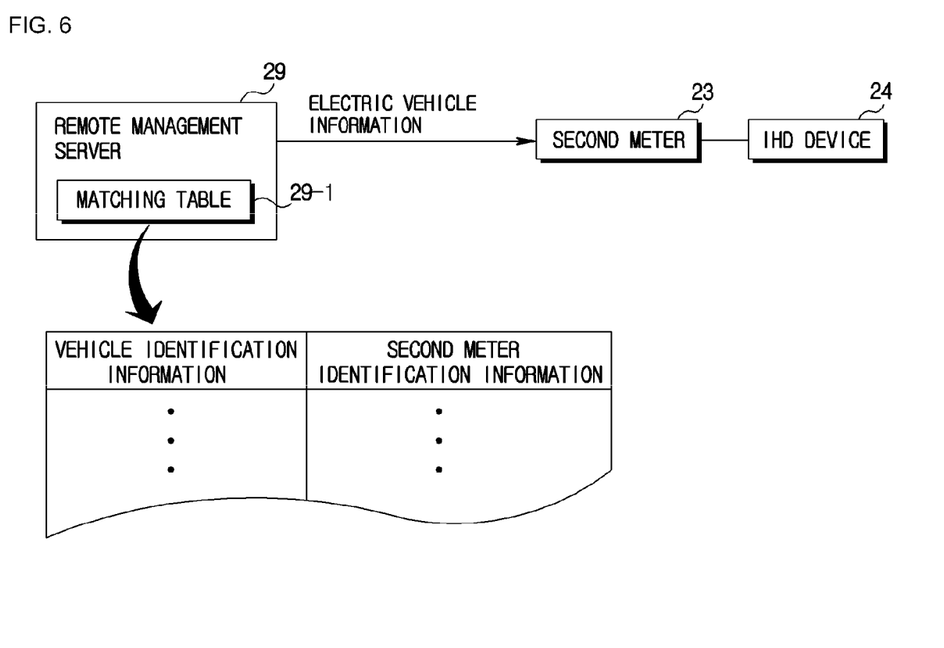
FIGS. 6 and 7 show an example of the process of transmitting electric vehicle information from a remote management server to an IHD device in an electric vehicle owner's home.

Referring to FIG. 6, the remote management server 29 receives electric vehicle information transmitted from the first meter 21, and directly transmits the received electric vehicle information to the second meter 23 placed in the home of a corresponding electric vehicle owner or transmits the received electric vehicle information to the second meter 23 through the second repeater 27.

To this end, the remote management server 29 stores and maintains a correspondence relation between vehicle identification information and second meter identification information for each of the electric vehicles in a matching table 29-1.

That is, the matching table 29-1 is used to determine which home each of the electric vehicles belongs to.

The method for managing the matching table may be variously configured. For example, if an electric vehicle owner, a management staff of an apartment building, etc. informs a manager of the remote management server of vehicle identification information (e.g., vehicle number) and an address of the electric vehicle owner, the manager of the remote management server may renew the matching table 29-1.

Generally, the remote management server 29 maintains the correspondence relation between the address of each home and the second meter installed in the corresponding home so as to remotely inspect the amount of energy used in each home. Thus, the second meter can be specified using the address of the electric vehicle owner, and accordingly, the matching table can be maintained.

Figure 7:
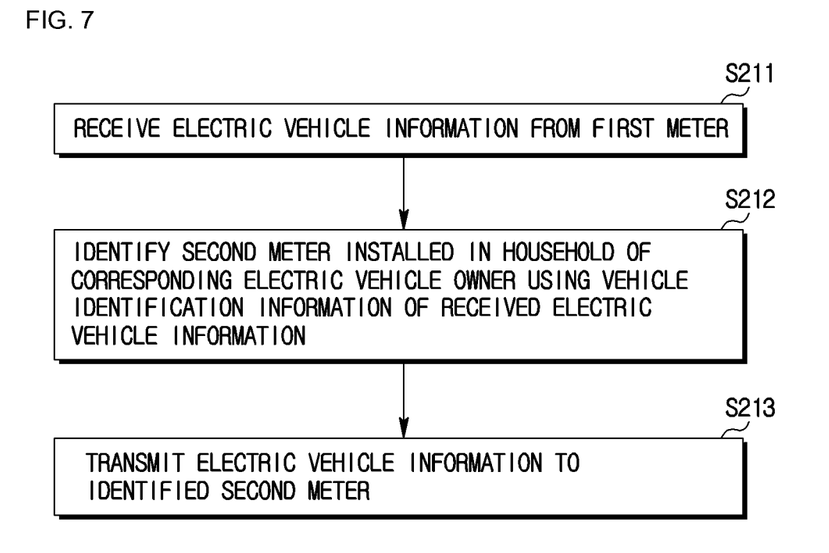

FIG. 7 shows an example of the operating process of the remote management server 29. If the remote management server 29 receives electric vehicle information (S211), the remote management server 29 identifies which second meter corresponds to electric vehicle information of the received electric vehicle information by inquiring the matching table (S212). That is, the remote management server 29 identifies to whom the electric vehicle information received at the step S212 will be transmitted.

Then, the remote management server 29 transmits the electric vehicle information to the second meter identified at the step S212 (S213).

If the remote management server 29 transmits the electric vehicle information, the second meter in the corresponding home receives the electric vehicle information, and transfers the received electric vehicle information to the IHD device 24 using various wired/wireless near-field communication schemes.

The IHD device 24 stores the electric vehicle information received from the second meter 23, and displays the stored electric vehicle information in various forms as occasion demands.

Figure 8:
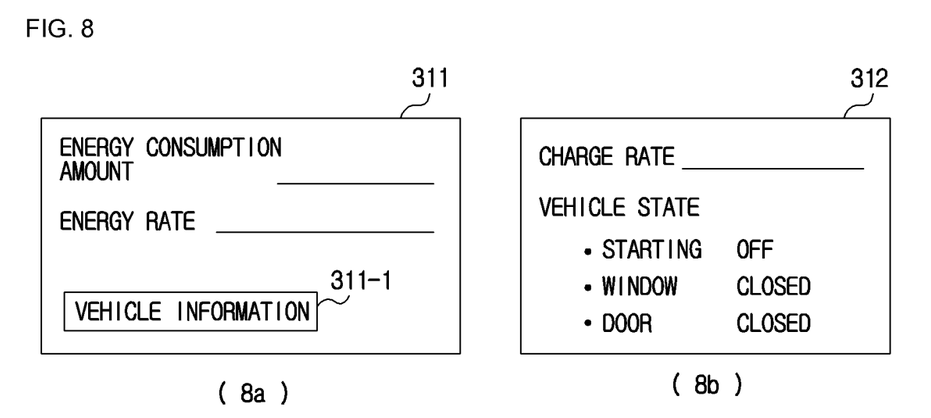
FIG. 8 shows an example of a user interface screen in the IHD device.

FIG. 8 shows an example of a screen provided by the IHD device 24. FIG. 8A is an example of a screen 311 on which energy related information including information on an energy consumption amount, information on an energy consumption rate, etc. is displayed. The second meter 23 may transmit the energy related information to the IHD device 24.

If a user selects a vehicle information menu 311-1, the IHD device 24 may provide a screen 312 informing the user of a charge rate consumed in charge of the electric vehicle and a current state of the electric vehicle, as shown in FIG. 8B. In the current state of the electric vehicle, the starting is in an off state, and the window and door are in a closed state.

FIG. 8 is a simple an example for better understanding of illustration, and it may be variously configured how the IHD device 24 will process the electric vehicle information, what is used as a user interface, or the like.

In a case where driving record information and video information according to time are included in the electric vehicle information, the IHD device 24 may provide information similar to that provided by a CCTV.

That is, the IHD device 24 displays a driving path of a corresponding electric vehicle on a map based on the driving record information, and may display video information photographed at a corresponding time together with the driving path. Then, the user can identify situations around the electric vehicle, photographed at the time, together with information on which road the user has driven. In this instance, the IHD device 24 may store and maintain map information so as to display the map.

The system according to the embodiment of the present invention may be configured so that the user can control the electric vehicle through the IHD device 24.

Figure 9:
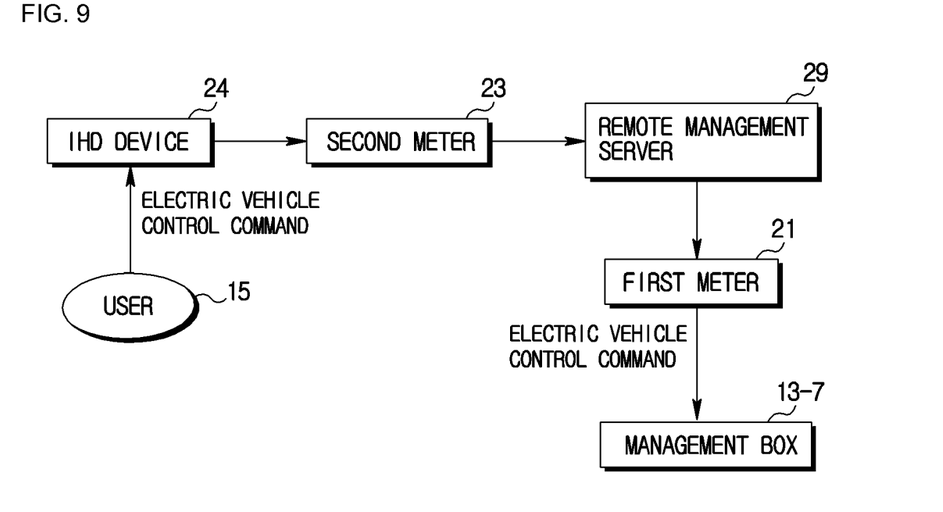
FIG. 9 shows an embodiment in which a user controls an electric vehicle in a parking lot through the IHD device.

Referring to FIG. 9, the IHD device 24 receives an electric vehicle control command inputted from a user 15 and transmits the electric vehicle control command to the second meter 23. The second meter 23 directly transmits the electric vehicle control command to the remote management server 29 or transmits the electric vehicle control command to the remote management server 29 through the second repeater 27.

The remote management server 29 directly transmits the electric vehicle control command to the first meter 21 or transmits the electric vehicle control command to the first meter 21 through the first repeater 26.

The first meter 21 transfers the electric vehicle control command to a management box 13-7 of the corresponding electric vehicle, and the management box 13-7 controls the electric vehicle 13 under the electric vehicle control command.

If the first meter performs an interface with the electric vehicle 13 through the charging device 11, the electric vehicle control command received by the first meter 21 is transferred to the management box 13-7 through the charging device 11.

The kind of control command that the user may issue through the IHD device 24 may be variously configured according to functions that the management box 13-7 can control. For example, the IHD device may issue a control command for on/off of starting, open/close of window, on/off of a headlight, adjustment of indoor temperature, or the like.

Figure 10:
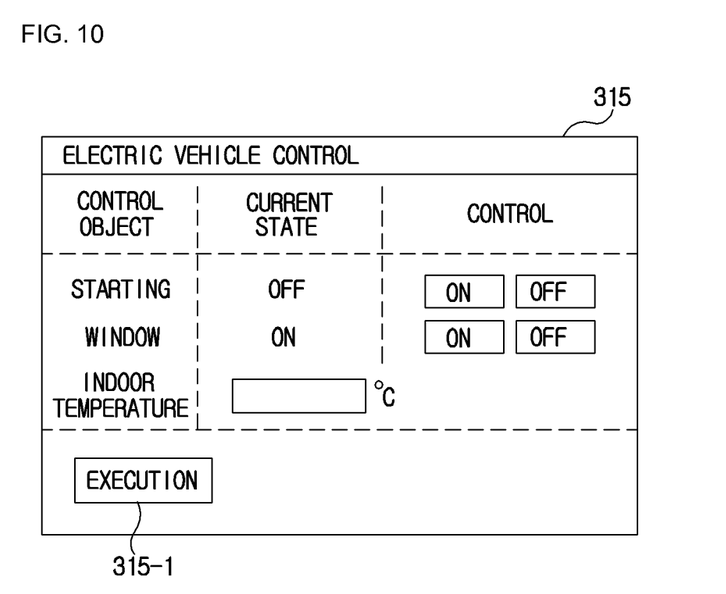
FIG. 10 shows an example of the user interface screen for controlling an electric vehicle.

FIG. 10 shows an example of a user interface screen 315 provided for the IHD device 24 to input an electric vehicle control command.

Starting, window and indoor temperature are displayed as control objects on the user interface screen 315. As current state information on each of the control objects, the current starting state is off, and the window is currently opened.

The user may input a control command for the starting or window by selecting an on/off button in a control item. The user may input a control command for the indoor temperature of the electric vehicle by selecting a desired temperature in a temperature setting item.

If the user selects an execution button 315-1, the IHD device 24 transmits the electric vehicle control command to the second meter 23.

FIG. 10 is merely an example for better understanding of illustration, and the user interface that enables the IHD device 24 to issue the electric vehicle control command may be variously configured as occasion demands.

Figure 11:
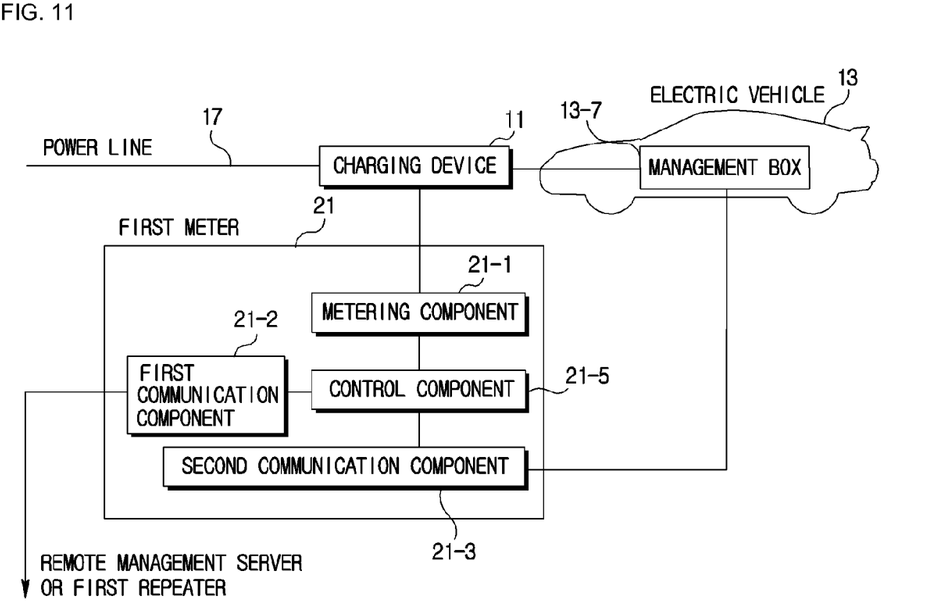
FIG. 11 shows a specific example for the first meter.

FIG. 11 shows a specific example for the first meter 21. The first meter 21 includes a metering component 21-1, a first communication component 21-2, a second communication component 21-3 and a control component 21-5.

The charging device 11 is connected to a power line 17 installed into a parking lot. If the electric vehicle is connected to the charging device 11, the charging device 11 enables a battery of the electric vehicle 13 to be charged by supplying electric energy to the electric vehicle 13.

The metering component 21-1 meters an amount of power used to charge the battery of the electric vehicle or a charge rate.

The first communication component 21-2 enables the first meter 21 to communicate with the remote management server 29 through the wide area communication network or enables the first meter 21 to communicate with the first repeater 26 through the near-field communication network.

The second communication component 21-3 enables the first meter 21 to communicate with the management box 13-7 of the electric vehicle. If the first meter 21 and the management box 13-7 are configured to communicate information with each other through the charging device 11, the second communication component 21-2 communicates with the charging device 11.

The control component 21-5 generally controls the first meter 21, and may be configured using a microprocessor or central processing unit (CPU).

Particularly, the control component 21-5 transmits electric vehicle information through the first communication component 21-2. Here, the electric vehicle information includes charge information metered by the metering component 21-1 and vehicle identification information and general management information, received through the second communication component 21-3.

The control component 21-5 transmits an electric vehicle control command received through the first communication component 21-2 to the management box 13-7 or the charging device 11 of the electric vehicle through the second communication component 21-3.

Figure 12:
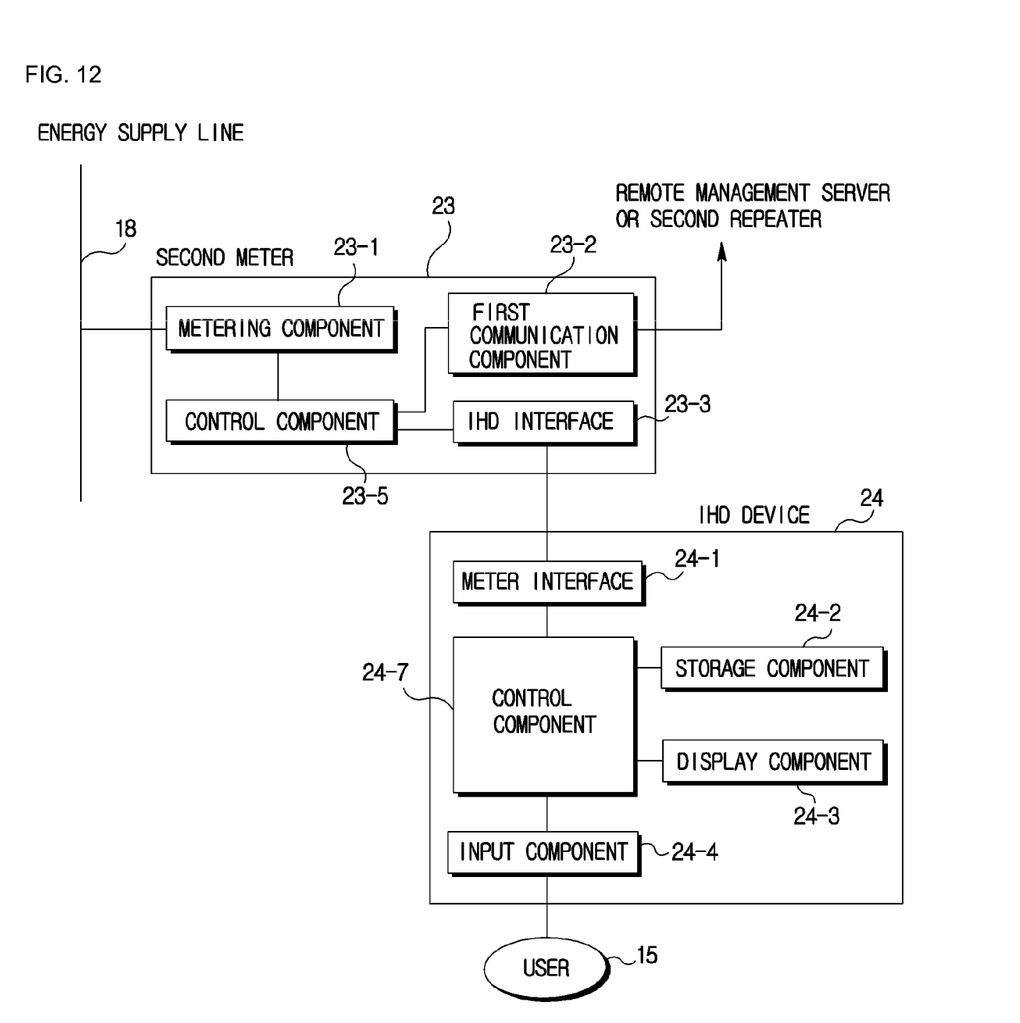
FIG. 12 shows a specific example for a second meter and the IHD device.

FIG. 12 shows a specific example for the second meter 23 and the IHD device 24.

The second meter 23 may include a metering component 23-1, a first communication component 23-2, an IHD interface 23-3 and a control component 23-5.

The metering component 23-1 is connected to an energy supply line 18 installed into a corresponding home so as to meter energy consumption information.

The first communication component 23-2 enables the second meter 23 to communicate with the remote management server 29 through the wide area communication network, or enables the second meter 23 to communicate with the second repeater 27 through the near-field communication network.

The IHD interface 23-3 enables the second meter 23 to communicate with the IHD device 24 through various wired/wireless communication schemes.

The control component 23-5 generally controls the second meter 23, and may be configured using a microprocessor or CPU.

Particularly, the control component 23-5 transmits energy consumption information or electric vehicle information to the IHD device 24 through the IHD interface 23-3. Here, the energy consumption information is metered by the metering component 23-1, and the electric vehicle information is received from the remote management server 29 through the first communication component 23-2.

The control component 23-5 transmits an electric vehicle control command received from the IHD device 24 through the IHD interface 23-3 to the remote management server 29 or the second repeater 27 through the first communication component 23-2.

The IHD device 24 may include a meter interface 24-1, a storage component 24-2, a display component 24-3, an input component 24-4 and a control component 24-7.

The meter interface 24-1 enables the IHD device 24 to communicate with the second meter 23 using various wired/wireless near-field communication schemes.

The storage component 24-2 stores various types of information necessary for the operation of the IHD device 24. Particularly, the storage component 24-2 stores electric vehicle information received from the second meter 23.

The display device 24-3 enables the IHD device 24 to visually display various types of information through a display screen.

The input component 24-4 enables a user to input information or command necessary for the operation of the IHD device 24 through an input device such as a keypad or touch screen.

The control component 24-7 generally controls the IHD device 24, and may be configured using a microprocessor or CPU.

The control component 24-7 stores and manages energy related information or electric vehicle information, received through the meter interface 24-1, in the storage component 24-2. As shown in the example of FIGS. 8A and 8B, the control component 24-7 processes energy consumption information or electric vehicle related information in various manners, and provides the processed information through the display component 24-3.

As shown in the example of FIG. 10, the control component 24-7 enables a user to input an electric vehicle control command, and transmits the inputted electric vehicle control command to the second meter 23 through the meter interface 24-1.

The control component 24-7 provides various user interface screens that enables the user to inquire energy related information or electric vehicle related information and to input an electric vehicle control command.

According to the present invention, when an electric vehicle is charged through a charging device installed in a parking lot, a meter collects and transmits various types of information related to the corresponding electric vehicle, and the transmitted information is finally transferred to an IHD device installed in the home of the corresponding electric vehicle owner via a remote management server.

Then, a user can conveniently identify, in the home, various type of information related to the electric vehicle of the electric vehicle owner, including charge information, driving record information, state information of the electric vehicle, video information photographed by a camera, burglar alarm information, and the like.

The IHD device may provide variously processed information or may provide various types of useful information related to use of the electric vehicle, including oil change information, component change information, and the like.

Since the meter of each home and the meter installed in the parking lot communicate with each other through the remote management server, the user may remotely control the electric vehicle in the parking lot through the IHD device. For example, the opened window may be closed, or the turned-on headlight may be turned off. Also, the internal temperature of the electric vehicle may be adjusted before the user gets on the electric vehicle.

Accordingly, it is possible to considerably improve convenience in the use of the electric vehicle, in relation to information management or control of the electric vehicle.

Although the present invention has been described in connection with the preferred embodiments, the embodiments of the present invention are only for illustrative purposes and should not be construed as limiting the scope of the present invention. It will be understood by those skilled in the art that various changes and modifications can be made thereto within the technical spirit and scope defined by the appended claims.

What is claimed is:

1. A system for remotely managing an electric vehicle, the system comprising:
    a first meter located remotely from the electric vehicle and configured to meter an amount of electric energy used to charge the electric vehicle and to receive data via communication with the electric vehicle;
    a first repeater configured to receive information related to the electric vehicle from the first meter and to relay the received information;
    a second repeater configured to relay the information related to the electric vehicle;
    a second meter installed in a user's home and configured to receive the information related to the electric vehicle from the second repeater;
    a remote management server configured to receive the information related to the electric vehicle from the first repeater, to transfer the information to the second repeater through a communication network, and to store a correspondence relationship between vehicle identification information and second meter identification information for each of a plurality of electric vehicles; and
    an in-home display (IHD) device configured to analyze and manage the information related to the electric vehicle that is received by the second meter and to transmit an electric vehicle control command to the electric vehicle sequentially via the second meter, the remote management server and the first meter, the control command input by a user via the IHD,
    wherein the control command is related to at least starting/turning off the vehicle, opening/closing a window, turning a headlight on/off or adjustment of internal temperature, and wherein the information related to the electric vehicle comprises at least a starting state, an open/closed state of a window or door, an on/off state of a headlight, a state of a burglar alarm or information input via a user input device.

2. The system of claim 1, wherein the communication network includes a wide area communication network.

3. The system of claim 2, wherein the wide area communication network comprises at least a wireless local area network (WLAN), an Internet network, a code division multiple access (CDMA) network, a personal communication service (PCS) network, a personal handyphone service (PHS) network, a wireless broadband Internet (Wibro) network or a Power Line Communication (PLC) network.

4. The system of claim 1, wherein the information related to the electric vehicle further comprises at least driving record information of the electric vehicle, component change information or video information photographed by a camera.

5. The system of claim 1, wherein:
the information related to the electric vehicle further comprises video information photographed by a camera and driving record information detected by at least a navigation device; and
the IHD device is further configured to reproduce a driving path and video of the electric vehicle based on the driving record information and the video information and display the reproduced driving path and video on a screen.

6. The system of claim 1, wherein the first meter communicates with the first repeater and the second meter communicates with the second repeater via a near-field communication network.

7. The system of claim 6, wherein the near-field communication network comprises at least a wireless local area network (WLAN), a power line communication (PLC) network, a Bluetooth™ network or a Zigbee™ network.

8. The system of claim 1, wherein the first repeater and second repeater communicate with the remote management server via a wide area communication network.

9. The system of claim 8, wherein the wide area communication network comprises at least a wireless local area network (WLAN), an Internet network, a division multiple access (CDMA) network, a personal communication service (PCS) network, a personal handyphone service (PHS) network, a wireless broadband Internet (Wibro) network or a Power Line Communication (PLC) network.

* * * * *